US012683597B2

(12) United States Patent
Zhao et al.

(10) Patent No.: US 12,683,597 B2
(45) Date of Patent: Jul. 14, 2026

(54) PROTECTION CIRCUIT FOR POWER SWITCH

(71) Applicant: TEXAS INSTRUMENTS INCORPORATED, Dallas, TX (US)

(72) Inventors: Xiaochun Zhao, Dallas, TX (US); Abidur Rahman, Dallas, TX (US); Eung Jung Kim, Dallas, TX (US); Tianhong Yang, Dallas, TX (US); Huijuan Li, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 266 days.

(21) Appl. No.: 18/455,656

(22) Filed: Aug. 25, 2023

(65) Prior Publication Data

US 2024/0259010 A1    Aug. 1, 2024

Related U.S. Application Data

(60) Provisional application No. 63/442,342, filed on Jan. 31, 2023.

(51) Int. Cl.
| | |
|---|---|
| *H02M 1/08* | (2006.01) |
| *H03K 17/06* | (2006.01) |
| *H03K 17/08* | (2006.01) |
| *H03K 17/0812* | (2006.01) |
| *H03K 17/22* | (2006.01) |

(52) U.S. Cl.
CPC .......... *H03K 17/0812* (2013.01); *H02M 1/08* (2013.01)

(58) Field of Classification Search
CPC ..................... H02M 1/08–088; H03K 17/0812
See application file for complete search history.

(56) References Cited

U.S. PATENT DOCUMENTS

| | | | | |
|---|---|---|---|---|
| 5,418,673 | A | * 5/1995 | Wong | H03K 17/063 |
| | | | | 361/18 |
| 5,467,047 | A | * 11/1995 | Robb | H03K 17/04123 |
| | | | | 327/377 |
| 5,592,117 | A | 1/1997 | Nadd | |

(Continued)

FOREIGN PATENT DOCUMENTS

WO      WO-2024163554 A1 *   8/2024   ........... H03K 17/223

OTHER PUBLICATIONS

International Search Report mailed May 29, 2024.

*Primary Examiner* — Sisay G Tiku
(74) *Attorney, Agent, or Firm* — Frank D. Cimino

(57) ABSTRACT

A transistor is coupled between a first voltage input and a voltage output in a first current path. First circuitry is coupled to a second voltage input, a control terminal of the transistor, and the voltage output. Second circuitry is coupled between the control terminal and ground in a second current path and between the control terminal and ground in a third current path parallel to the second current path. The second current path includes the control terminal, first and second terminals of the second circuitry, and ground. The third current path includes the control terminal, a second and the third terminal of the second circuitry, and ground. Third circuitry is coupled between the control terminal and the voltage output in a fourth current path. The fourth current path includes the control terminal, first and second terminals of the third circuitry, and the voltage output.

21 Claims, 8 Drawing Sheets

(56)        References Cited

U.S. PATENT DOCUMENTS

| | | | |
|---|---|---|---|
| 6,603,341 | B2 | 8/2003 | Tuchiya |
| 10,038,438 | B2 | 7/2018 | Nakano |
| 2009/0237126 | A1* | 9/2009 | Chen ................ H03K 17/08122 |
| | | | 327/109 |
| 2018/0013392 | A1* | 1/2018 | Han ........................ H03F 1/523 |
| 2019/0372571 | A1* | 12/2019 | Finn ................ H03K 19/09448 |

* cited by examiner

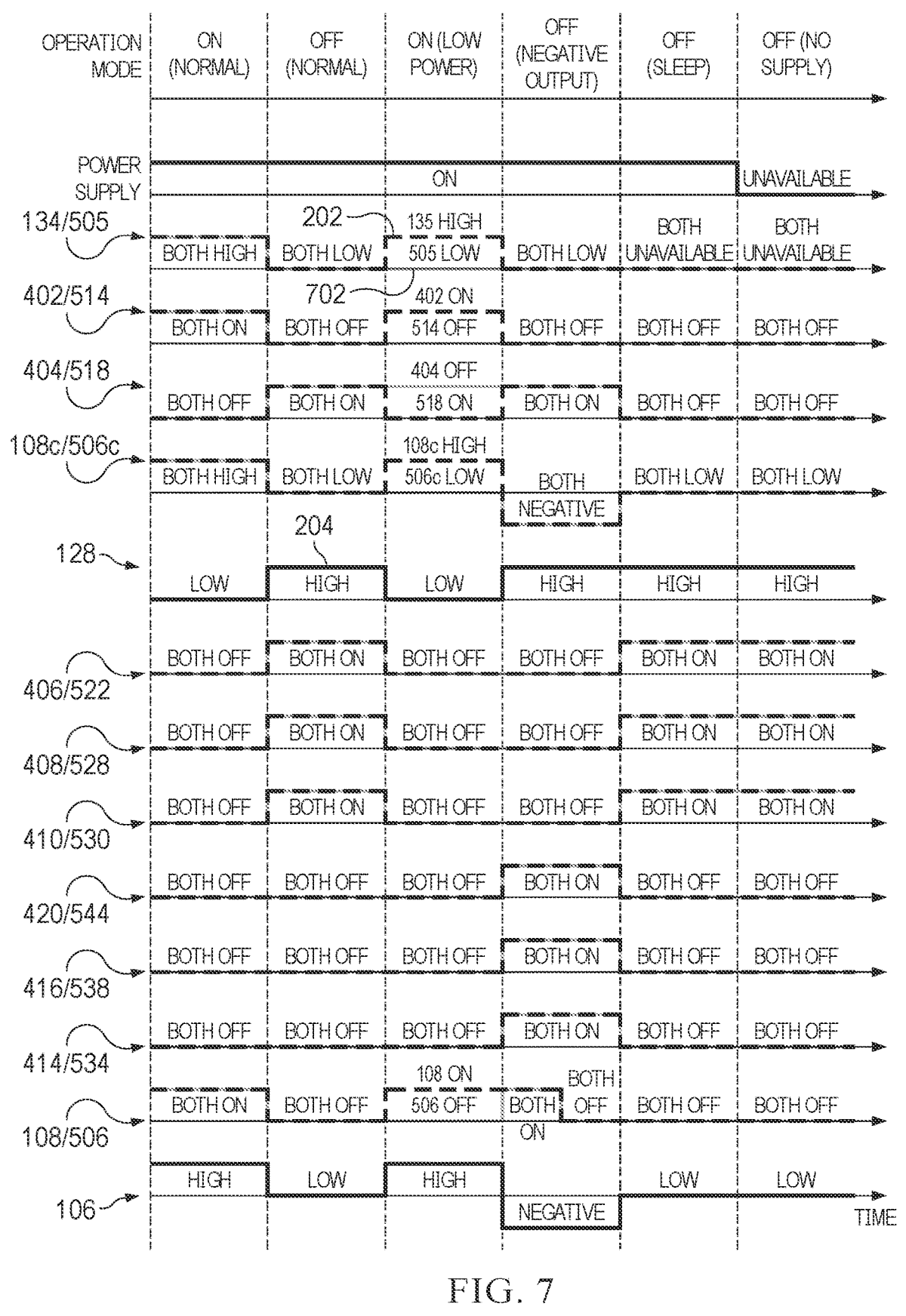

| OPERATION MODE | ON (NORMAL) | OFF (NORMAL) | ON (LOW POWER) | OFF (NEGATIVE OUTPUT) | OFF (SLEEP) | OFF (NO SUPPLY) |
|---|---|---|---|---|---|---|
| POWER SUPPLY | ON | | | | | UNAVAILABLE |
| 134/505 | BOTH HIGH | BOTH LOW (202) | 135 HIGH / 505 LOW | BOTH LOW | BOTH UNAVAILABLE | BOTH UNAVAILABLE |
| 402/514 | BOTH ON | BOTH OFF (702) | 402 ON / 514 OFF | BOTH OFF | BOTH OFF | BOTH OFF |
| 404/518 | BOTH OFF | BOTH ON | 404 OFF / 518 ON | BOTH ON | BOTH OFF | BOTH OFF |
| 108c/506c | BOTH HIGH | BOTH LOW | 108c HIGH / 506c LOW | BOTH NEGATIVE | BOTH LOW | BOTH LOW |
| 128 | LOW | HIGH (204) | LOW | HIGH | HIGH | HIGH |
| 406/522 | BOTH OFF | BOTH ON | BOTH OFF | BOTH OFF | BOTH ON | BOTH ON |
| 408/528 | BOTH OFF | BOTH ON | BOTH OFF | BOTH OFF | BOTH ON | BOTH ON |
| 410/530 | BOTH OFF | BOTH ON | BOTH OFF | BOTH OFF | BOTH ON | BOTH ON |
| 420/544 | BOTH OFF | BOTH OFF | BOTH OFF | BOTH ON | BOTH OFF | BOTH OFF |
| 416/538 | BOTH OFF | BOTH OFF | BOTH OFF | BOTH ON | BOTH OFF | BOTH OFF |
| 414/534 | BOTH OFF | BOTH OFF | BOTH OFF | BOTH ON | BOTH OFF | BOTH OFF |
| 108/506 | BOTH ON | BOTH OFF | 108 ON / 506 OFF | BOTH ON / BOTH OFF | BOTH OFF | BOTH OFF |
| 106 | HIGH | LOW | HIGH | NEGATIVE | LOW | LOW |

TIME

FIG. 7

PROTECTION CIRCUIT FOR POWER SWITCH

REFERENCE TO RELATED APPLICATION

This application claims the benefit of U.S. Provisional Application No. 63/442,342, filed on Jan. 31, 2023, the contents of which are hereby incorporated by reference in their entirety.

BACKGROUND

Many modern devices include various electrical circuits. Some electrical circuits include a switch between a power supply and a load to connect and disconnect the power supply from the load. Connecting a power supply to a load through a switch allows current to be provided from the power supply to the load to power the load. Transistors (e.g., metal-oxide-semiconductor field effect transistors (MOS-FETs)) can be used as switches by controlling a voltage at a control terminal (e.g., a gate electrode) of the transistor.

SUMMARY

In one example, a circuit includes a first voltage input, a second voltage input, and a voltage output. A transistor is coupled between the first voltage input and the voltage output in a first current path. The first current path includes the first voltage input, a first terminal of the transistor, a second terminal of the transistor, and the voltage output. First circuitry is coupled between the second voltage input and a control terminal of the transistor in a first control path, and coupled between the voltage output and the control terminal of the transistor in a second control path. The first control path includes the second voltage input, a first terminal of the first circuitry, a third terminal of the first circuitry, and the control terminal of the transistor. The second control path includes the voltage output, a second terminal of the first circuitry, the third terminal of the first circuitry, and the control terminal of the transistor. Second circuitry is coupled between the control terminal of the transistor and ground in a second current path and coupled between the control terminal of the transistor and ground in a third current path parallel to the second current path. The second current path includes the control terminal of the transistor, a first terminal of the second circuitry, a third terminal of the second circuitry, and ground. The third current path includes the control terminal of the transistor, a second terminal of the second circuitry, the third terminal of the second circuitry, and ground. Third circuitry is coupled between the control terminal of the transistor and the voltage output in a fourth current path. The fourth current path includes the control terminal of the transistor, a first terminal of the third circuitry, a second terminal of the third circuitry, and the voltage output.

In one example, a circuit includes a first voltage input, a second voltage input, a first control signal input, a second control signal input, and a voltage output. A first transistor is coupled between the first voltage input and the voltage output in a first current path. The first current path includes the first voltage input, a first terminal of the first transistor, a second terminal of the first transistor, and the voltage output. A second transistor includes a first terminal coupled to second voltage input, a second terminal coupled to a control terminal of the first transistor, and a control terminal coupled to the first control signal input. A third transistor includes a first terminal coupled to the control terminal of the first transistor, a second terminal coupled to the voltage output, and a control terminal coupled to the first control signal input. A fourth transistor is coupled between the control terminal of the first transistor and ground in both a second current path and a third current path parallel to than the second current path. The second current path and the third current path include the control terminal of the first transistor, a first terminal of the fourth transistor, a second terminal of the fourth transistor, and ground. The fourth transistor includes a control terminal coupled to the second control signal input. A fifth transistor is coupled between the control terminal of the first transistor and the first terminal of the fourth transistor in the second current path. The second current path further includes a first terminal of the fifth transistor and a second terminal of the fifth transistor. A sixth transistor is coupled between the control terminal of the first transistor and the first terminal of the fourth transistor in the third current path. The third current path further includes a first terminal of the sixth transistor and a second terminal of the sixth transistor. A seventh transistor is coupled between the control terminal of the first transistor and the voltage output in a fourth current path. The fourth current path includes the control terminal of the first transistor, a first terminal of the seventh transistor, a second terminal of the seventh transistor, and the voltage output. An eighth transistor is coupled between ground and the voltage output in a fifth current path. The fifth current path includes ground, a first terminal of the eighth transistor, a second terminal of the eighth transistor, and the voltage output. The eighth transistor includes a control terminal coupled to a control terminal of the seventh transistor. A ninth transistor is coupled between ground and the first terminal of the eighth transistor in the fifth current path. The fifth current path further includes a first terminal of the ninth transistor and a second terminal of the ninth transistor.

In one example, a system includes a controller, a voltage source, a voltage converter, load circuitry, and switching circuitry. The controller includes a first output and a second output. The voltage converter includes an input and an output. The input of the voltage converter is coupled to the voltage source. The load circuitry includes an input. The switching circuitry is coupled to the controller, the voltage source, the voltage converter, and the load circuitry. The switching circuitry includes a first voltage input, a second voltage input, a voltage output, a first control signal input, a second control signal input, a first transistor, transistor control circuitry, first protection circuitry, and second protection circuitry. The first voltage input is coupled to the voltage source. The second voltage input is coupled to the output of the voltage converter. The voltage output is coupled to the input of the load circuitry. The first control signal input is coupled to the first output of the controller. The second control signal input is coupled to the second output of the controller. The first transistor is coupled between the first voltage input and the voltage output in a first current path. The first current path includes the first voltage input, a first terminal of the first transistor, a second terminal of the first transistor, and the voltage output. The transistor control circuitry is coupled between the second voltage input and a control terminal of the first transistor in a first control path, and coupled between the voltage output and the control terminal of the first transistor in a second control path. The transistor control circuitry includes a control terminal coupled to the first control signal input. The first control path includes the second voltage input, a first terminal of the transistor control circuitry, a third terminal of the transistor control circuitry, and the control terminal of the first transistor. The second control path includes the voltage output, a second terminal of the transistor control circuitry, the third terminal of the transistor control circuitry, and the control terminal of the first transistor. The first protection circuitry is coupled between the control terminal of the first transistor and ground in a second current path and coupled between the control terminal of the first transistor and ground in a third current path parallel to than the second current path. The first protection circuitry includes a control terminal coupled to the second control signal input. The second current path includes the control terminal of the first transistor, a first terminal of the first protection circuitry, a third terminal of the first protection circuitry, and ground. The third current path includes the control terminal of the first transistor, a second terminal of the first protection circuitry, the third terminal of the first protection circuitry, and ground. The second protection circuitry is coupled between the control terminal of the first transistor and the voltage output in a fourth current path. The second protection circuitry includes a control terminal coupled to the voltage output. The fourth current path includes the control terminal of the first transistor, a first terminal of the second protection circuitry, a second terminal of the second protection circuitry, and the voltage output.

BRIEF DESCRIPTION OF THE DRAWINGS

FIG. 7 is an example timing diagram corresponding to the circuit of FIG. 5A and FIG. 5B.

The same reference numbers or other reference designators are used in the drawings to designate the same or similar (functionally and/or structurally) features.

DETAILED DESCRIPTION

The following description provides many different examples for implementing different features of the provided subject matter. Specific examples of components and arrangements are described below to simplify the present description. The drawings are not drawn to scale.

Figure 1:
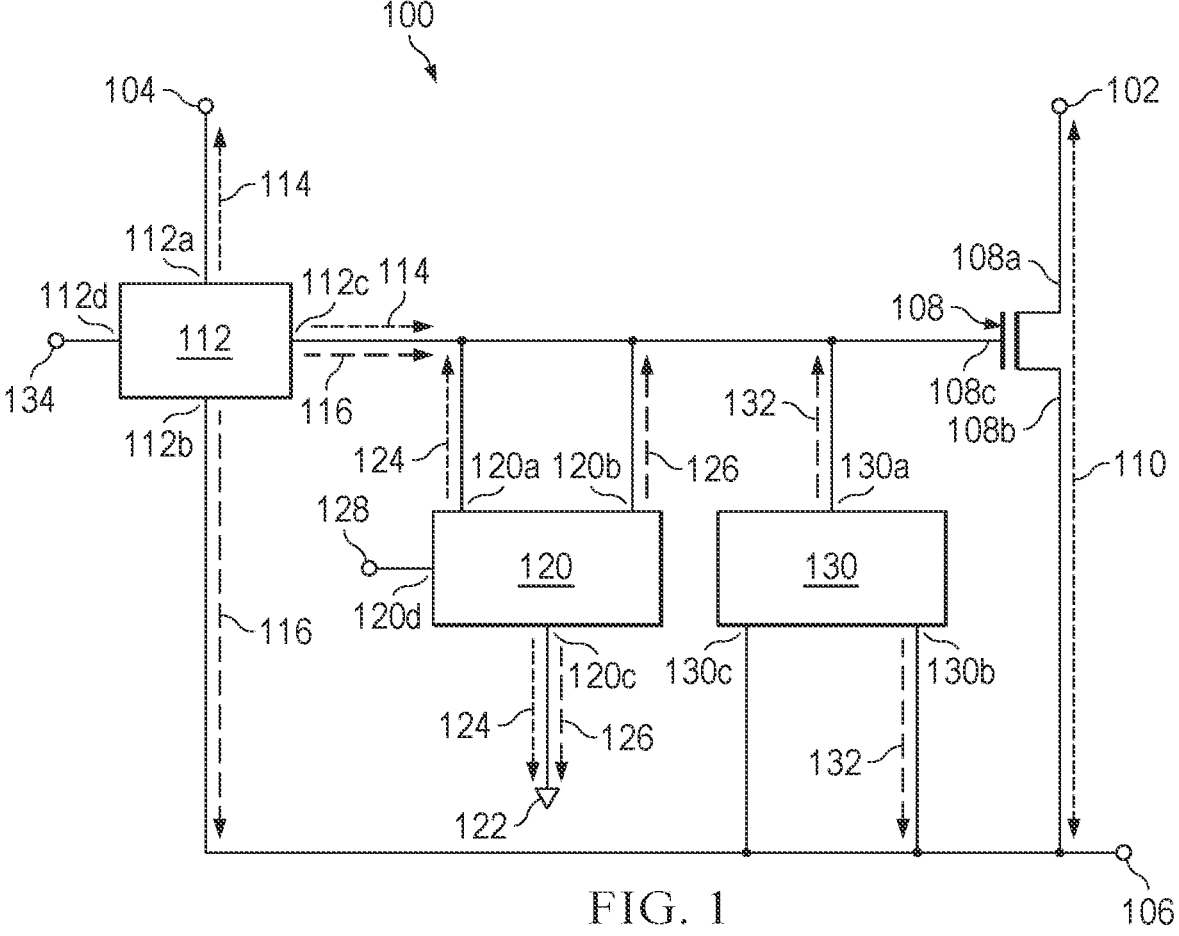
FIG. 1 is a circuit diagram of some examples of a switching circuit.

FIG. 1 is a circuit diagram of some examples of a switching circuit 100. The circuit 100 includes a first voltage input 102, a second voltage input 104, a first control signal input 134, a second control signal input 128, and a voltage output 106. A first transistor 108 is coupled between the first voltage input 102 and a voltage output 106 in a first current path 110. Transistor 108 includes a first terminal 108a, a second terminal 108b, and a control terminal 108c. The first current path 110 includes the first voltage input 102, the first terminal 108a of transistor 108, the second terminal 108b of transistor 108, and the voltage output 106. Transistor 108 is configured to selectively couple the first voltage input 102 to the voltage output 106 so that current can flow from the first voltage input 102 to the voltage output 106 via the first current path 110.

First transistor control circuitry 112 is coupled to the control terminal 108c of transistor 108. More specifically, the first transistor control circuitry 112 is coupled between the second voltage input 104 and the control terminal 108c of transistor 108 in a first control path 114 (e.g., a first pull-up path). Further, the first transistor control circuitry 112 is coupled between the voltage output 106 and the control terminal 108c of transistor 108 in a second control path 116 (e.g., a first pull-down path). The first transistor control circuitry 112 includes a first terminal 112a, a second terminal 112b, a third terminal 112c, and a control terminal 112d. The first control path 114 includes the second voltage input 104, the first terminal 112a of the first transistor control circuitry 112, the third terminal 112c of the first transistor control circuitry 112, and the control terminal 108c of transistor 108. The second control path 116 includes the voltage output 106, the second terminal 112b of the first transistor control circuitry 112, the third terminal 112c of the first transistor control circuitry 112, and the control terminal 108c of transistor 108. The control terminal 112d of the first transistor control circuitry 112 is coupled to the first control signal input 134.

The transistor control circuitry 112 is configured to receive a first control signal (e.g., first control signal 202 of FIG. 2) at the control terminal 112d from the first control signal input 134. The first transistor control circuitry 112 is configured to selectively couple the control terminal 108c of transistor 108 to either the second voltage input 104 (via the first control path 114) or the voltage output 106 (via the second control path 116) based on the first control signal.

For example, when the first control signal is HIGH, the first transistor control circuitry 112 couples the second voltage input 104 to the control terminal 108c of transistor 108 via the first control path 114 (e.g., the first transistor control circuitry 112 pulls up control terminal 108c). Thus, the voltage at the control terminal 108c of transistor 108 is HIGH, as shown, for example, in FIG. 2. In response, transistor 108 turns ON so that the first voltage input 102 is coupled to the voltage output 106. Thus, the voltage at the voltage output 106 is HIGH. Conversely, when the first control signal is LOW, the first transistor control circuitry 112 couples the voltage output 106 to the control terminal 108c of transistor 108 via the second control path 116 (e.g., the first transistor control circuitry 112 pulls down control terminal 108c). Thus, the voltage at the control terminal 108c of transistor 108 is LOW, as shown, for example, in FIG. 2. In response, transistor 108 turns OFF so that the first voltage input 102 is not coupled to the voltage output 106. Thus, the voltage at the voltage output 106 is LOW.

One challenge with the circuit is ensuring transistor 108 stays OFF when there is no power supply coupled to the circuit 100 (e.g., when there is no voltage at the first voltage input 102 nor the second voltage input 104, and when no signal is received at control terminal 112d and thus transistor control circuitry 112 does not couple the second voltage input 104 nor the voltage output 106 to control terminal 108c). In some circuits, a protection resistor (not shown) is coupled between the control terminal 108c of transistor 108 and the voltage output 106 to passively couple the control terminal 108c of transistor 108 to the voltage output 106 so that transistor 108 is kept OFF when there is no power supply coupled to the circuit 100.

However, using the protection resistor (not shown) to passively couple the control terminal 108c of transistor 108 to the voltage output 106 makes it challenging to operate in low power mode (e.g., when transistor 108 is ON and the total current consumed by the power supply (not shown) is less than about 10 microamps, less than about 8 microamps, less than about 6 microamps, or some other suitable value). For example, when transistor 108 is ON, the difference between the voltage at the control terminal 108c of transistor 108 and the voltage at the voltage output 106 (e.g., the gate-to-source voltage Vgs) is greater than zero. Because of this non-zero voltage difference, current leaks from the control terminal 108c to the voltage output 106 through the protection resistor (not shown). This leakage current may cause the power supply (not shown) to consume more current than is allowed during low power mode. Thus, low power mode may be unattainable when the protection resistor (not shown) is coupled between the control terminal 108c and the voltage output 106.

In various examples of the present description, the circuit 100 includes first protection circuitry 120 and second protection circuitry 130 for ensuring transistor 108 stays OFF when there is no power supply coupled to the circuit 100 without hindering low power mode.

The first protection circuitry 120 is coupled between the control terminal 108c of transistor 108 and ground 122 in a second current path 124. Further, the first protection circuitry 120 is coupled between the control terminal 108c of transistor 108 and ground 122 in a third current path 126. The third current path 126 is parallel to the second current path 124. The first protection circuitry 120 includes a first terminal 120a, a second terminal 120b, a third terminal 120c, and a control terminal 120d. The second current path 124 includes the control terminal 108c of transistor 108, the first terminal 120a of the first protection circuitry 120, the third terminal 120c of the first protection circuitry 120, and ground 122. The third current path 126 includes the control terminal 108c of transistor 108, the second terminal 120b of the first protection circuitry 120, the third terminal 120c of the first protection circuitry 120, and ground 122. The control terminal 120d of the first protection circuitry 120 is coupled to the second control signal input 128.

The second protection circuitry 130 is coupled between the control terminal 108c of transistor 108 and the voltage output 106 in a fourth current path 132. The second protection circuitry 130 includes a first terminal 130a, a second terminal 130b, and a control terminal 130c. The fourth current path 132 includes the control terminal 108c of transistor 108, the first terminal 130a of the second protection circuitry 130, the second terminal 130b of the second protection circuitry 130, and the voltage output 106. The control terminal 130c of the second protection circuitry 130 is coupled to the voltage output 106.

The first protection circuitry 120 is configured to receive a second control signal (e.g., second control signal 204 of FIG. 2) at control terminal 120d from the second control signal input 128. The first protection circuitry 120 is configured to selectively couple the control terminal 108c of transistor 108 to ground 122 (via the second current path 124 and the third current path 126) based on the second control signal and the voltage at the control terminal 108c of transistor 108. The second protection circuitry 130 is configured to selectively couple the control terminal 108c of transistor 108 to the voltage output 106 (via the fourth current path 132) based on the voltage at the voltage output 106.

Figure 2:
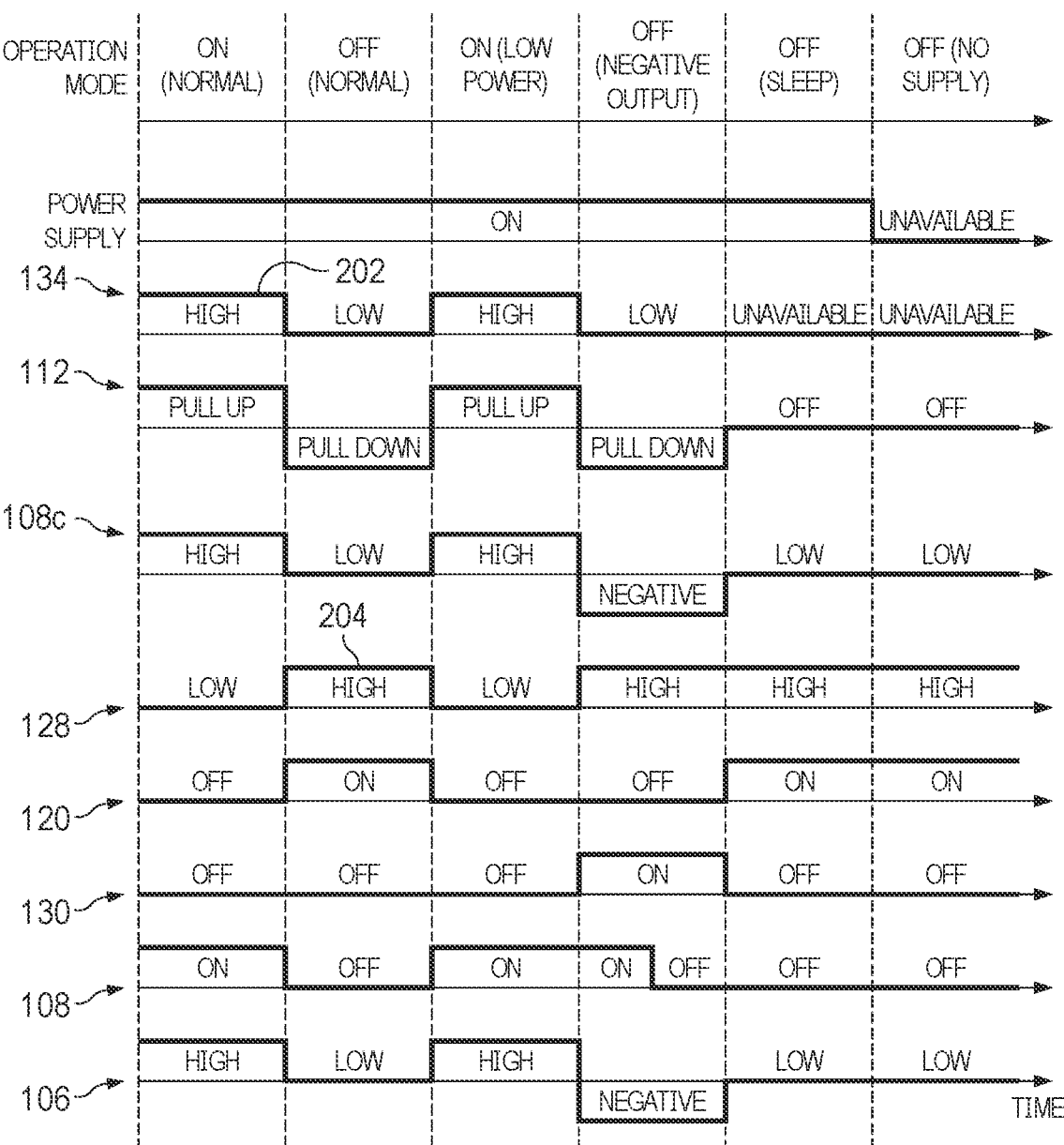
FIG. 2 is an example timing diagram corresponding to the circuit of FIG. 1.

For example, when the second control signal (at the control terminal 120d of the first protection circuitry 120) is HIGH and the voltage at the control terminal 108c of transistor 108 is non-negative (e.g., when there is no power supply coupled to the circuit 100), the first protection circuitry 120 is ON and the second protection circuitry 130 is OFF, as shown, for example, in FIG. 2. Thus, the control terminal 108c of transistor 108 is coupled to ground 122 (via the second current path 124 and the third current path 126), but not to the voltage output 106, and hence the voltage at the control terminal 108c of transistor 108 is LOW. In response, transistor 108 is OFF. Thus, the first protection circuitry 120 can ensure transistor 108 stays OFF when there is no power supply coupled to the circuit 100.

When the voltage at the voltage output 106 (and at the control terminal 130c of the second protection circuitry 130) is negative (e.g., during circuit testing such as direct power injection (DPI) testing or the like), the first protection circuitry 120 is OFF and the second protection circuitry 130 is ON. Thus, the control terminal 108c of transistor is coupled to the voltage output 106, but not to ground 122, and hence the difference between the voltage at the control terminal 108c of transistor 108 and the voltage at the voltage output 106 is approximately zero. In response, transistor 108 is OFF. Thus, the second protection circuitry 130 ensures transistor 108 stays OFF when the voltage at the voltage output 106 is negative.

When the second control signal is LOW (e.g., when transistor 108 is ON in normal power mode or low power mode) and the voltage at the voltage output 106 is non-negative, the first protection circuitry 120 is OFF and the second protection circuitry 130 is OFF, as shown, for example, in FIG. 2. In response, the control terminal 108c of transistor 108 is not coupled to ground 122 by the first protection circuitry 120 nor to the voltage output 106 by the second protection circuitry 130. Thus, current leakage from control terminal 108c to ground 122 or to the voltage output 106 may be eliminated and hence the power supply current consumption requirement (e.g., less than about 10 microamps, less than about 8 microamps, less than about 6 microamps, or some other suitable value) for low power mode can be achieved. In some examples, low power mode can be enabled when a load at the voltage output 106 is low in order to improve an efficiency of the circuit.

FIG. 2 is an example timing diagram corresponding to the circuit 100 of FIG. 1.

Referring to FIG. 1 and FIG. 2, during normal ON mode (e.g., when the power supply (not shown) is coupled to the circuit 100, transistor 108 is to be ON, and there are no power supply current restrictions), the first control signal 202 is HIGH. In response, the first transistor control circuitry 112 couples the second voltage input 104 to the control terminal 108c (e.g., pulls up the control terminal 108c to the second voltage input 104) via the first control path 114. Thus, the voltage at the control terminal 108c of transistor 108 is HIGH. In response, transistor 108 is ON so the first voltage input 102 is coupled to the voltage output 106. Thus, the voltage at the voltage output 106 is HIGH. Further, the second control signal 204 is LOW. Thus, the first protection circuitry 120 is OFF. Furthermore, because the voltage at the voltage output 106 is non-negative, the second protection circuitry 130 is OFF.

During normal OFF mode (e.g., when the power supply (not shown) is coupled to the circuit 100, transistor 108 is to be OFF, and there are no power supply current restrictions), the first control signal 202 is LOW. In response, the first transistor control circuitry 112 couples the voltage output 106 to the control terminal 108c (e.g., pulls down the control terminal 108c to the voltage output 106) via the second control path 116. Thus, the voltage at the control terminal 108c of transistor 108 is LOW. In response, transistor 108 is OFF so the first voltage input 102 is not coupled to the voltage output 106. Thus, the voltage at the voltage output 106 is LOW. Further, the second control signal 204 is HIGH. Because the second control signal 204 is HIGH and the voltage at the control terminal 108c of transistor 108 is non-negative, the first protection circuitry 120 is ON. Furthermore, because the voltage at the voltage output 106 is non-negative, the second protection circuitry 130 is OFF.

During low power mode (e.g., when the power supply (not shown) is coupled to the circuit 100, transistor 108 is to be ON, and the amount of current consumed by the power supply must be less than about 10 microamps, less than about 8 microamps, less than about 6 microamps, or some other suitable value), the first control signal 202 is HIGH. In response, the first transistor control circuitry 112 couples the second voltage input 104 to the control terminal 108c (e.g., pulls up the control terminal 108c to the second voltage input 104) via the first control path 114. Thus, the voltage at the control terminal 108c of transistor 108 is HIGH. In response, transistor 108 is ON so that the first voltage input 102 is coupled to the voltage output 106. Thus, the voltage at the voltage output 106 is HIGH. Further, the second control signal 204 is LOW. Thus, the first protection circuitry 120 is OFF. Furthermore, because the voltage output is non-negative, the second protection circuitry 130 is OFF.

In some cases, a negative voltage may be applied at the voltage output 106 (e.g., during circuit testing such as direct power injection (DPI) testing or some other circuit testing). During this negative output voltage mode (e.g., when the voltage at the voltage output 106 is negative, the power supply is coupled to the circuit 100, and transistor 108 is to be OFF), transistor 108 may be briefly turned ON. Because the voltage at the voltage output 106 is negative, the second protection circuitry 130 turns ON. In response, the control terminal 108c of transistor is coupled to the voltage output 106 via the fourth current path 132. Thus, the difference between the voltage at the control terminal 108c of transistor 108 and the voltage at the voltage output (e.g., the gate-to-source voltage Vgs) drops to approximately zero. In response, transistor 108 turns OFF.

During sleep mode (e.g., when the power supply is coupled to the circuit 100, transistor 108 is to be OFF and the amount of current consumed by the power supply connected to the circuit must be less than 2 microamps, less than 1 microamp, or some other suitable value), the first control signal 202 is unavailable and thus transistor control circuitry 112 does not couple the control terminal 108c to the second voltage input 104 nor the voltage output 106. The second control signal 204 remains available and is HIGH. Because the second control signal 204 is HIGH and the voltage at the control terminal 108c of transistor 108 is non-negative, the first protection circuitry 120 is ON. In response, the control terminal 108c of transistor 108 is coupled to ground 122 via the second current path 124 and the third current path 126. Thus, the voltage at the control terminal 108c of transistor 108 is LOW. In response, the first transistor 108 is OFF so that the first voltage input 102 is not coupled to the voltage output 106. Thus, the voltage at the voltage output 106 is LOW. Furthermore, because the voltage at the voltage output 106 is non-negative, the second protection circuitry 130 is OFF.

During no power supply mode (e.g., when the power supply is not coupled to the circuit 100 and transistor 108 is to be OFF), the first control signal 202 is unavailable and thus transistor control circuitry 112 does not couple the control terminal 108c to the second voltage input 104 nor the voltage output 106. The second control signal 204 remains available and is HIGH. Because the second control signal 204 is HIGH and the voltage at the control terminal 108c of transistor 108 is non-negative, the first protection circuitry 120 is ON. In response, the control terminal 108c of transistor 108 is coupled to ground 122 via the second current path 124 and the third current path 126. Thus, the voltage at the control terminal 108c of transistor 108 is LOW. In response, the first transistor 108 is OFF so that the first voltage input 102 is not coupled to the voltage output 106. Thus, the voltage at the voltage output 106 is LOW. Furthermore, because the voltage at the voltage output 106 is non-negative, the second protection circuitry 130 is OFF.

In some examples, the second control signal 204 is available during sleep mode and no power supply mode because the second control signal 204 is generated using a power-on reset (POR) signal which is available regardless of operation mode.

Figure 3:
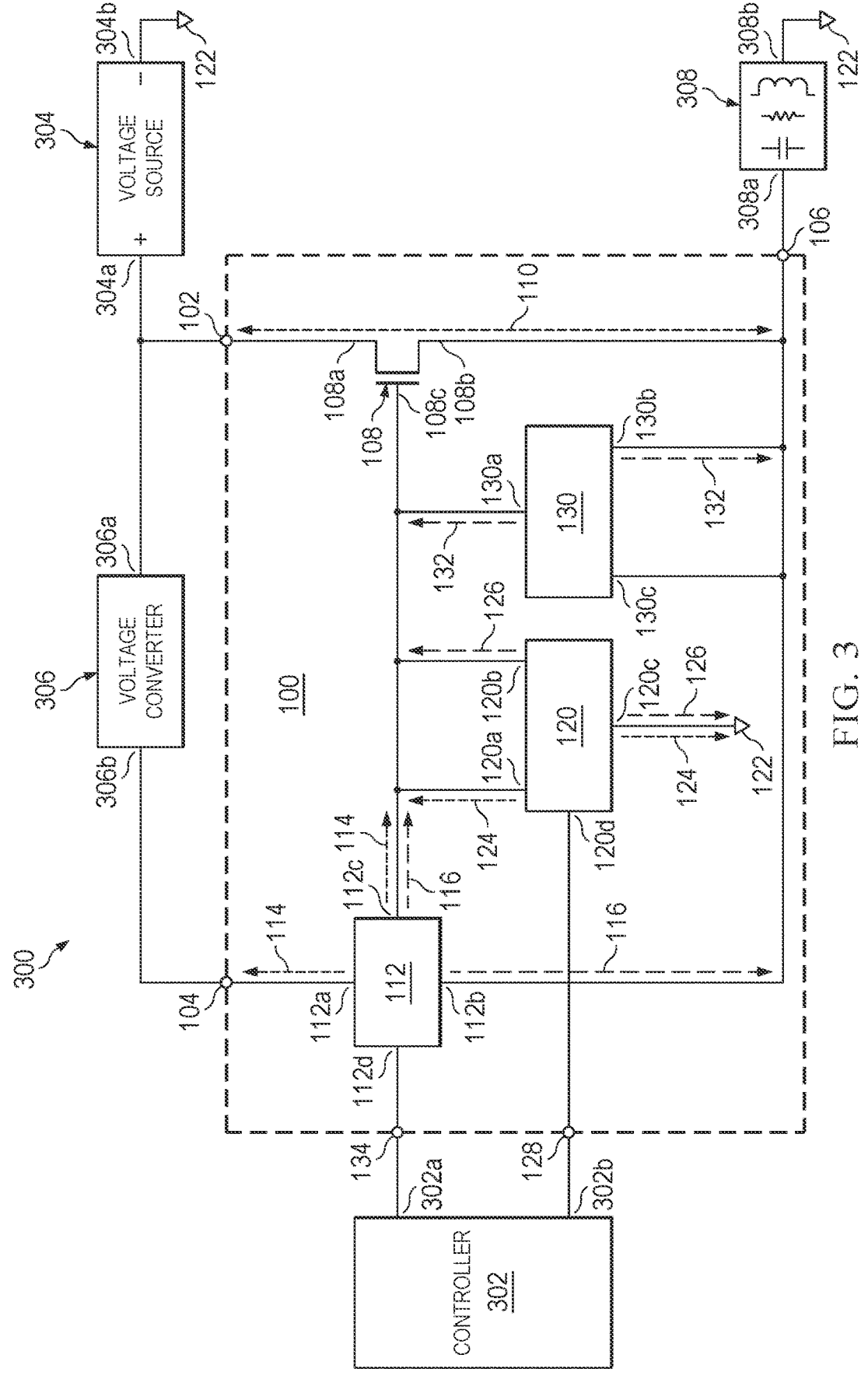
FIG. 3 is a circuit diagram of some examples of a system including the circuit of FIG. 1.

FIG. 3 is a circuit diagram of some examples of a system 300 including the circuit 100 of FIG. 1. The system 300 further includes a controller 302, a voltage source 304, a voltage converter 306, and load circuitry 308.

The controller 302 (e.g., a microcontroller or some other suitable controller circuitry) includes a first output 302a and a second output 302b. The first output 302a of the controller 302 is coupled to the first control signal input 134 of circuit 100. The second output 302b of the controller 302 is coupled to second control signal input 128 of circuit 100.

The voltage source 304 (e.g., a battery or some other suitable direct current (DC) voltage source) includes a first terminal 304a (e.g., a positive terminal) and a second terminal 304b (e.g., a negative terminal). The first terminal 304a is coupled to the first voltage input 102 of circuit 100 and the voltage converter 306. In some examples, the second terminal 304b is coupled to ground 122.

The voltage converter 306 (e.g., a charge pump, a boost DC-to-DC converter, or some other suitable voltage conversion circuitry) includes an input 306a and an output 306b. The input 306a of the voltage converter 306 is coupled to the first terminal 304a of the voltage source 304. The output 306b of the voltage converter 306 is coupled to the second voltage input 104 of circuit 100. In some examples, the voltage source 304 and the voltage converter 306 are part of the power supply.

The load circuitry 308 includes a first terminal 308a and a second terminal 308b. The first terminal 308a of the load circuitry 308 is coupled to the voltage output 106 of circuit 100. In some examples, the second terminal 308b of the load circuitry 308 is coupled to ground 122. The load circuitry 308 may for example, include resistor(s), inductor(s), and capacitor(s).

The controller 302 is configured to generate the first control signal (e.g., first control signal 202 of FIG. 2) and the second control signal (e.g., second control signal 204 of FIG. 2). The controller 302 is configured to provide the first control signal to the control terminal 112d of the first transistor control circuitry 112 via the first control signal input 134 to control the first transistor control circuitry 112. The controller 302 is configured to provide the second control signal to the control terminal 120d of the first protection circuitry 120 via the second control signal input 128 to control the first protection circuitry 120.

The voltage source 304 is configured to generate a first voltage (e.g., a DC voltage) at the first terminal 304a. The voltage converter 306 is configured to receive the first voltage (at input 306a) from the voltage source 304 and generate a second voltage (at output 306b) greater than the first voltage. In some examples, the first voltage is in a range from about 3 volts to about 40 volts or some other suitable range. Further, the second voltage is about 8 volts higher than the first voltage, 10 volts higher than the first voltage, 12 volts higher than the first voltage, or some other suitable voltage.

Circuit 100 is configured to provide current to the load circuitry 308 by selectively coupling the voltage source 304 to the load circuitry 308 using transistor 108.

Figure 4:
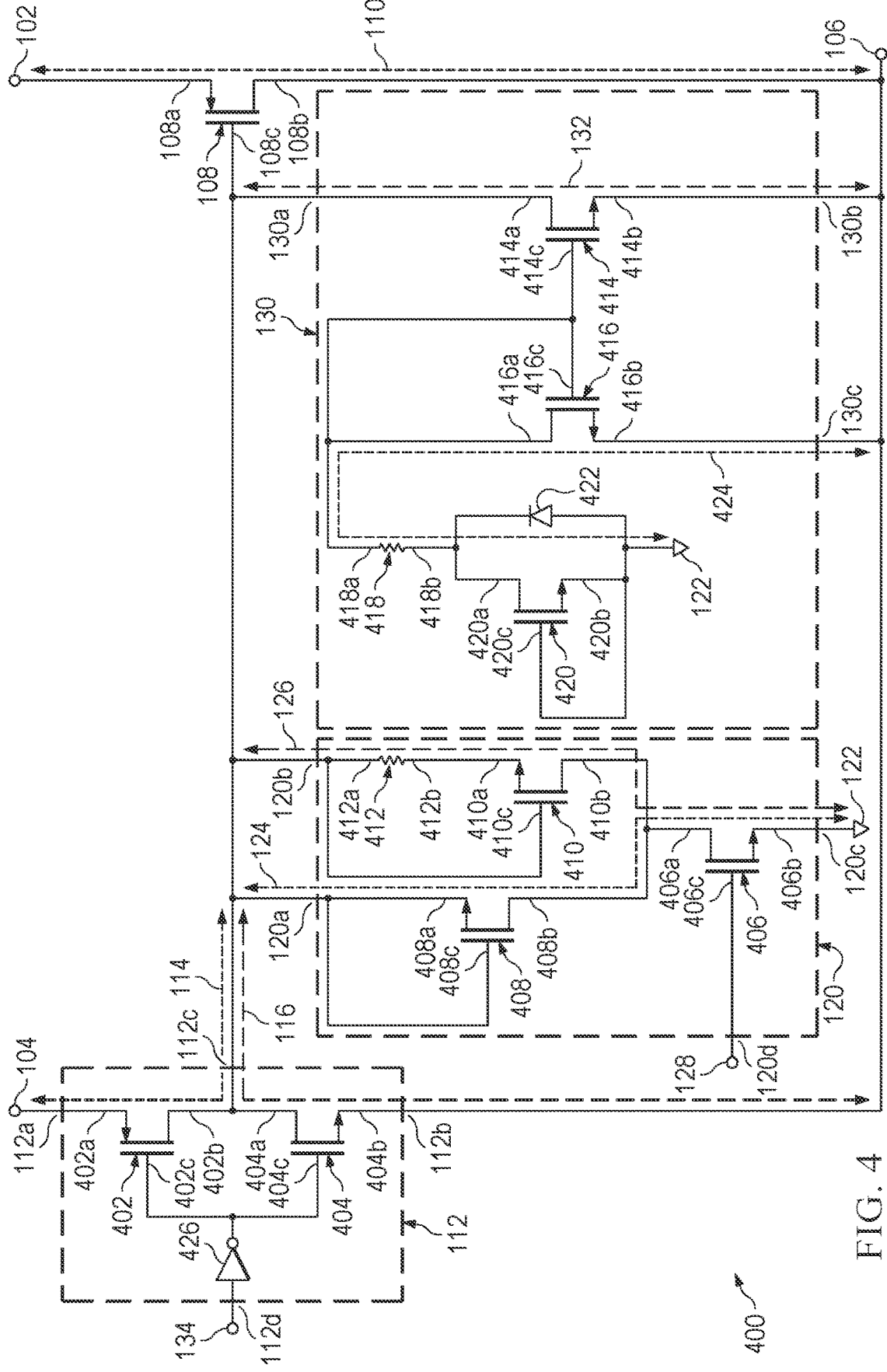
FIG. 4 is a circuit diagram of some other examples of a switching circuit.

FIG. 4 is a circuit diagram of some examples of a circuit 400 similar to the circuit 100 of FIG. 1 in which the first transistor control circuitry 112, the first protection circuitry 120, and the second protection circuitry 130 include a plurality of transistors.

For example, the first transistor control circuitry 112 includes a second transistor 402 (e.g., a pull-up transistor) and a third transistor 404 (e.g., a pull-down transistor). Transistor 402 is coupled between the second voltage input 104 and the control terminal 108c of transistor 108 in the first control path 114. The first control path includes the second voltage input 104, a first terminal 402a of transistor 402, a second terminal 402b of transistor 402, and the control terminal 108c of transistor 108.

Transistor 404 is coupled between the voltage output 106 and the control terminal 108c of transistor 108 in the second control path 116. The second control path 116 includes the voltage output 106, a first terminal 404a of transistor 404, a second terminal 404b of transistor 404, and the control terminal 108c of transistor 108.

In some examples, the first transistor control circuitry 112 further includes an inverter 426. An input (not labeled) of inverter 426 is coupled to the first control signal input 134. A control terminal 402c of transistor 402 is coupled to an output (not labeled) of inverter 426. Further, a control terminal 404c of transistor 404 is coupled to the output (not labeled) of inverter 426.

Inverter 426 is configured to receive the first control signal (e.g., first control signal 202 of FIG. 7) from the first control signal input 134. Inverter 426 inverts the first control signal and outputs an inverted first control signal. Transistor 402 and transistor 404 are configured to receive the inverted first control signal at control terminal 402c and control terminal 404c, respectively, from inverter 426. Transistor 402 is configured to selectively couple the control terminal 108c of transistor 108 to the second voltage input 104 (via the first control path 114) based on the (inverted) first control signal. Transistor 404 is configured to selectively couple the control terminal 108c of transistor 108 to the voltage output 106 (via the second control path 116) based on the (inverted) first control signal.

For example, when the first control signal is HIGH (when the inverted first control signal is LOW), transistor 402 is ON and transistor 404 is OFF, as shown, for example, in FIG. 7. In response, the second voltage input 104 is coupled to the control terminal 108c of transistor 108 via the first control path 114. Thus, the voltage at the control terminal 108c of transistor is HIGH. In response, transistor 108 turns ON so that the first voltage input 102 is coupled to the voltage output 106. Thus, the voltage at the voltage output 106 is HIGH. Conversely, when the first control signal is LOW (when the inverted first control signal is HIGH), transistor 402 turns OFF and transistor 404 turns ON, as shown, for example, in FIG. 7. In response, the voltage output 106 is coupled to the control terminal 108c of transistor 108 via the second control path 116. Thus, the voltage at the control terminal 108c is LOW. In response, transistor 108 turns OFF and hence the first voltage input 102 is not coupled to the voltage output 106. Thus, the voltage at the voltage output 106 is LOW.

The first protection circuitry 120 includes a fourth transistor 406, a fifth transistor 408, a sixth transistor 410, and a first resistor 412. Transistor 406 is coupled between the control terminal 108c of the first transistor 108 and ground 122 in both the second current path 124 and the third current path 126. A control terminal 406c of transistor 406 is coupled to the second control signal input 128.

Transistor 408 is coupled between the control terminal 108c of transistor 108 and a first terminal 406a of transistor 406 in the second current path 124. A control terminal 408c of transistor 408 is coupled to a first terminal 408a of transistor 408 so that transistor 408 is a "diode-connected" transistor that allows unidirectional current flow from the control terminal 108c of transistor 108 to ground 122.

Transistor 410 is coupled between the control terminal 108c of transistor 108 and the first terminal 406a of transistor 406 in the third current path 126. Resistor 412 is coupled between the control terminal 108c of transistor 108 and a first terminal 410a of transistor 410 in the third current path 126. A control terminal 410c of transistor 410 is coupled to the first terminal 410a of transistor 410 (through resistor 412) so that transistor 410 is a "diode-connected" transistor that allows unidirectional current flow from the control terminal 108c of transistor 108 to ground 122.

The second current path 124 includes the control terminal 108c of transistor 108, the first terminal 408a of transistor 408, a second terminal 408b of transistor 408, the first terminal 406a of transistor 406, a second terminal 406b of transistor 406, and ground 122. The third current path 126 includes the control terminal 108c of the first transistor 108, a first terminal 412a of resistor 412, a second terminal 412b of resistor 412, the first terminal 410a of transistor 410, a second terminal 410b of transistor 410, the first terminal 406a of transistor 406, the second terminal 406b of transistor 406, and ground 122.

Transistor 406 is configured to receive a second control signal (e.g., second control signal 204 of FIG. 7) at the control terminal 406c of transistor 406 from second control signal input 128. Transistor 406, transistor 408, and transistor 410 are configured to selectively couple the control terminal 108c of transistor 108 to ground 122 (via the second current path 124 and the third current path 126) based on the second control signal and the voltage at the control terminal 108c of transistor 108.

For example, when the second control signal (e.g., second control signal 204 of FIG. 7) is HIGH, transistor 406 is ON, as shown, for example, in FIG. 7. When transistor 406 is ON and the voltage at the control terminal 108c is non-negative, transistor 408 and transistor 410 are ON (e.g., transistor 408 and transistor 410 are forward biased). When transistor 408 is ON, the control terminal 108c of transistor 108 is coupled to ground 122 via the second current path 124. However, the voltage drop across transistor 408 is greater than zero. Thus, the voltage at the control terminal 108c of transistor 108 is greater than zero. To bring the voltage at the control terminal 108c of transistor 108 closer to zero, transistor 410 is included in the first protection circuitry 120. Transistor 410 has a reduced voltage drop. For example, transistor 410 is a "natural" device having a voltage drop approximately equal to zero. When transistor 410 is ON, the control terminal 108c of transistor 108 is coupled to ground 122 via the third current path 126 and thus the voltage at the control terminal 108c of transistor 108 is pulled down to approximately zero. Resistor 412 is included in the third current path 126 to limit the current in the third current path 126 to protect transistor 410. Thus, transistor 408 flows a majority of the current from the control terminal 108c of transistor 108 to ground 122 (via the second current path 124) while transistor 410 flows a minority of the current from the control terminal 108c of transistor 108 to ground 122 (via the third current path 126). When the control terminal 108c of transistor 108 is coupled to ground 122, the voltage at the control terminal 108c of transistor 108 is LOW. In response, transistor 108 is OFF so that the first voltage input 102 is not coupled to the voltage output. Thus, the voltage at the voltage output 106 is LOW.

When the second control signal is LOW, transistor 406 is OFF and hence transistor 408 and transistor 410 are OFF, as shown, for example, in FIG. 7. Thus, the control terminal 108c of transistor 108 is not coupled to ground 122.

Further, when the voltage at the voltage output 106 is negative, transistor 408 and transistor 410 are OFF (e.g., reverse biased), as shown, for example, in FIG. 7. Thus, the control terminal 108c of transistor 108 is not coupled to ground 122.

The second protection circuitry 130 includes a seventh transistor 414, an eighth transistor 416, a second resistor 418, and a ninth transistor 420. Transistor 414 is coupled between the control terminal 108c of transistor 108 and the voltage output 106 in the fourth current path 132. The fourth current path includes the control terminal 108c of transistor 108, a first terminal 414a of transistor 414, a second terminal 414b of transistor 414, and the voltage output 106.

Transistor 416 is coupled between the voltage output 106 and ground 122 in a fifth current path 424. A control terminal 416c of transistor 416 is coupled to a first terminal 416a of transistor 416 so that transistor 416 is a "diode-connected" transistor that allows unidirectional current flow from ground 122 to the voltage output 106. A control terminal 414c of transistor 414 is coupled to the control terminal 416c of transistor 416.

Resistor 418 is coupled between the first terminal 416a of transistor 416 and ground 122 in the fifth current path 424. Transistor 420 is coupled between a second terminal 418b of resistor 418 and ground 122 in the fifth current path 424. A control terminal 420c of transistor 420 is coupled to a second terminal 420b of transistor 420 so that transistor 420 is a "diode-connected" transistor that allows unidirectional current flow from ground 122 to the voltage output 106. In some examples, transistor 420 forms a body diode 422 that is coupled between the second terminal 420b and a first terminal 420a of transistor 420.

The fifth current path 424 includes ground 122, the second terminal 420b of transistor 420, the first terminal 420a of transistor 420, the second terminal 418b of resistor 418, a first terminal 418a of resistor 418, the first terminal 416a of transistor 416, a second terminal 416b of transistor 416, and the voltage output 106.

Transistor 414 is configured to selectively couple the control terminal 108c of transistor 108 to the voltage output 106 (via the fourth current path 132) based on the voltage at the voltage output 106. For example, when the voltage at the voltage output 106 is negative, transistor 416 and transistor 420 are ON (e.g., transistor 416 and transistor 420 are forward biased). Thus, current can flow from ground 122 to the voltage output 106 via the fifth current path 424. In response to transistor 416 and transistor 420 turning ON, transistor 414 turns ON. Because transistor 414 is ON, the control terminal 108c of transistor 108 is coupled to the voltage output 106. Thus, the voltage at the control terminal 108c of transistor 108 is approximately equal to the voltage at the voltage output 106. In response, transistor 108 is OFF so that the first voltage input 102 is not coupled to the voltage output 106.

Further, when the voltage at the voltage output 106 is non-negative, transistor 416 and transistor 420 are OFF (e.g., reverse biased) and hence transistor 414 is OFF, as shown, for example, in FIG. 7. Thus, control terminal 108c is not coupled to the voltage output 106.

During low power mode, the second control signal is LOW and the voltage at the voltage output 106 is non-negative. In response, transistor 406, transistor 408, transistor 410, transistor 416, transistor 420, and transistor 414 are OFF so that control terminal 108c is not coupled to ground 122 nor the voltage output 106. Thus, current leakage from control terminal 108c to ground 122 or to the voltage output 106 may be eliminated. As a result, the power supply current consumption requirement for low power mode can be met.

Although transistor 408, transistor 410, transistor 416, and transistor 420 are referred to as "diode-connected transistors", it will be appreciated that in some examples, these transistors could alternatively be referred to as unidirectional current devices and/or could alternatively be diodes or the like.

Figure 5A:
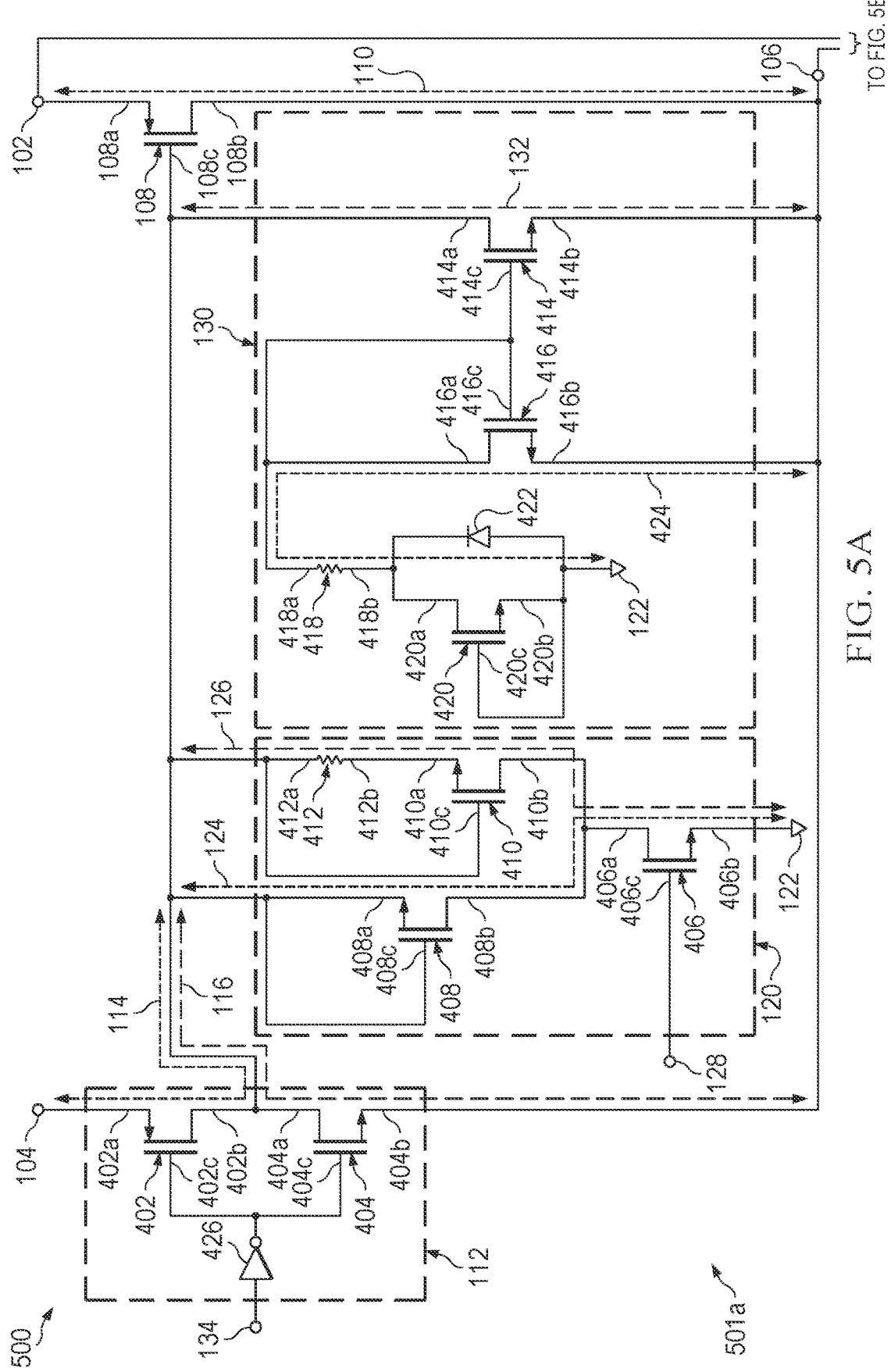
FIG. 5A and FIG. 5B are a circuit diagram of some other examples of a switching circuit.
Figure 5B:
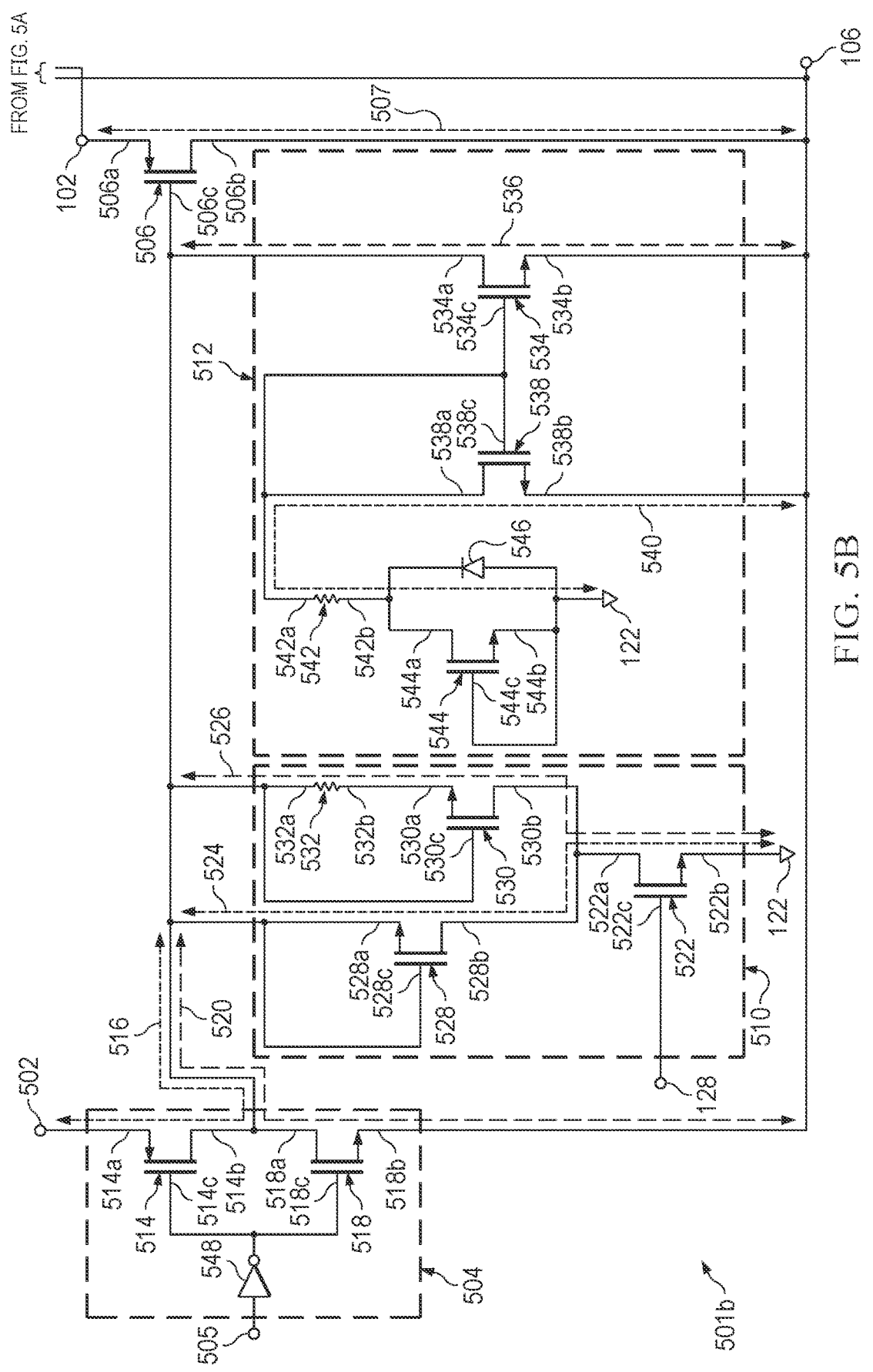

FIG. 5A and FIG. 5B are a circuit diagram of some examples of a circuit 500 similar to the circuit 400 of FIG. 4 in which a tenth transistor 506 is coupled between the first voltage input 102 and the voltage output 106 in a sixth current path 507 that is parallel to the first current path 110.

The circuit 500 includes a first portion 501a and a second portion 501b. The first portion 501a includes the first voltage input 102, the second voltage input 104, the first control signal input 134, the second control signal input 128, the voltage output 106, transistor 108, the first transistor control circuitry 112 (including transistor 402, transistor 404, and inverter 426), the first protection circuitry 120 (including transistor 406, transistor 408, transistor 410, and resistor 412), and the second protection circuitry 130 (including transistor 414, transistor 416, resistor 418, and transistor 420), which are coupled together as discussed with reference to FIG. 4. Further, the first portion 501a includes the first current path 110, the first control path 114, the second control path 116, the second current path 124, the third current path 126, the fourth current path 132, and the fifth current path 424, as discussed with reference to FIG. 4.

In brief, the second portion 501b is a copy of the first portion 501a. More specifically, the second portion 501b includes the first voltage input 102, a third voltage input 502, a third control signal input 505, the second control signal input 128, the voltage output 106, a tenth transistor 506, second transistor control circuitry 504, third protection circuitry 510, and fourth protection circuitry 512.

Transistor 506 is coupled between the first voltage input 102 and the voltage output 106 in a sixth current path 507. The sixth current path 507 includes the first voltage input 102, a first terminal 506a of transistor 506, a second terminal 506b of transistor 506, and the voltage output 106. The sixth current path 507 is parallel to the first current path 110.

The second transistor control circuitry 504 includes an eleventh transistor 514 and a twelfth transistor 518. Transistor 514 is coupled between the third voltage input 502 and a control terminal 506c of transistor 506 in a third control path 516 (e.g., a second pull-up path). The third control path 516 includes the third voltage input 502, a first terminal 514a of transistor 514, a second terminal 514b of transistor 514, and the control terminal 506c of transistor 506. Transistor 518 is coupled between the voltage output 106 and the control terminal 506c of transistor 506 in a fourth control path 520 (e.g., a second pull-down path). The fourth control path 520 includes the voltage output 106, a second terminal

518*b* of transistor 518, a first terminal 518*a* of transistor 518, and the control terminal 506*c* of transistor 506.

In some examples, the second transistor control circuitry 504 further includes an inverter 548. An input (not labeled) of inverter 548 is coupled to the third control signal input 505. A control terminal 514*c* of transistor 514 is coupled to an output (not labeled) of inverter 548. A control terminal 518*c* of transistor 518 is coupled to the output (not labeled) of inverter 548.

The third protection circuitry 510 includes a thirteenth transistor 522, a fourteenth transistor 528, a fifteenth transistor 530, and a third resistor 532. Transistor 528 and transistor 522 are coupled between the control terminal 506*c* of transistor 506 and ground 122 in a seventh current path 524. The seventh current path 524 includes the control terminal 506*c* of transistor 506, a first terminal 528*a* of transistor 528, a second terminal 528*b* of transistor 528, a first terminal 522*a* of transistor 522, a second terminal 522*b* of transistor 522, and ground 122.

Resistor 532, transistor 530, and transistor 522 are coupled between the control terminal 506*c* of transistor 506 and ground 122 in an eighth current path 526. The eighth current path 526 includes the control terminal 506*c* of transistor 506, a first terminal 532*a* of resistor 532, a second terminal 532*b* of resistor 532, a first terminal 530*a* of transistor 530, a second terminal 530*b* of transistor 530, the first terminal 522*a* of transistor 522, the second terminal 522*b* of transistor 522, and ground 122.

A control terminal 522*c* of transistor 522 is coupled to the second control signal input 128. A control terminal 528*c* of transistor 528 is coupled to the first terminal 528*a* of transistor 528 so that transistor 528 is a "diode-connected" transistor that allows unidirectional current flow from the control terminal 108*c* of transistor 108 to ground 122 (via the seventh current path 524). A control terminal 530*c* of transistor 530 is coupled to the first terminal 530*a* of transistor 530 (through resistor 532) so that transistor 530 is a "diode-connected" transistor that allows unidirectional current flow from the control terminal 108*c* of transistor 108 to ground 122 (via the eighth current path 526).

The fourth protection circuitry 512 includes a sixteenth transistor 534, a seventeenth transistor 538, a fourth resistor 542, and an eighteenth transistor 544. Transistor 534 is coupled between the control terminal 506*c* of transistor 506 and the voltage output 106 in a ninth current path 536. The ninth current path 536 includes the control terminal 506*c* of transistor 506, a first terminal 534*a* of transistor 534, a second terminal 534*b* of transistor 534, and the voltage output 106.

Transistor 538, resistor 542, and transistor 544 are coupled between the voltage output 106 and ground 122 in a tenth current path 540. The tenth current path 540 includes ground 122, a second terminal 544*b* of transistor 544, a first terminal 544*a* of transistor 544, a second terminal 542*b* of resistor 542, a first terminal 542*a* of resistor 542, a first terminal 538*a* of transistor 538, a second terminal 538*b* of transistor 538, and the voltage output 106. In some examples, transistor 544 forms a body diode 546 that is coupled between the second terminal 544*b* and the first terminal 544*a* of transistor 544.

A control terminal 534*c* of transistor 534 is coupled to a control terminal 538*c* of transistor 538. The control terminal 538*c* of transistor 538 is coupled to the first terminal 538*a* of transistor 538 so that transistor 538 is a "diode-connected" transistor that allows unidirectional current flow from ground 122 to the voltage output 106 (via the tenth current path 540). A control terminal 544*c* of transistor 544 is coupled to the second terminal 544*b* of transistor 544 so that transistor 544 is a "diode-connected" transistor allows unidirectional current flow from ground 122 to the voltage output 106 (via the tenth current path 540).

In some example systems, the first voltage input 102 is coupled to a voltage source (e.g., voltage source 304 of FIG. 3), the second voltage input 104 is coupled to an output of a first voltage converter (e.g., output 306*b* of voltage converter 306 of FIG. 3), and the third voltage input 502 is coupled to an output of a second voltage converter (not shown), different than the first voltage converter. Further, the third control signal input 505 is coupled to an output of a controller (e.g., a third output (not shown) of controller 302 of FIG. 3).

In some examples, transistors 108, 404, 406, 408, 410, 414, 416, 420, 506, 518, 522, 528, 530, 534, 538, 544 are n-channel metal oxide semiconductor field effect transistors (MOSFETs), and transistors 402, 514 are p-channel MOS-FETs. Although the transistors shown in FIG. 4, FIG. 5A, and FIG. 5B are illustrated and described as being MOS-FETs, in some other examples the transistors can alternatively be corresponding bipolar junction transistors (BJTs), junction field-effect transistors (JFETs), or some other suitable transistors.

Transistor 108 includes a first number of channels and transistor 506 includes a second number of channels, greater than the first number of channels. For example, transistor 108 includes one channel and transistor 506 includes two or more channels (e.g., two channels, three channels, four channels, five channels, etc.). Other numbers of channels are also possible.

Figure 6:
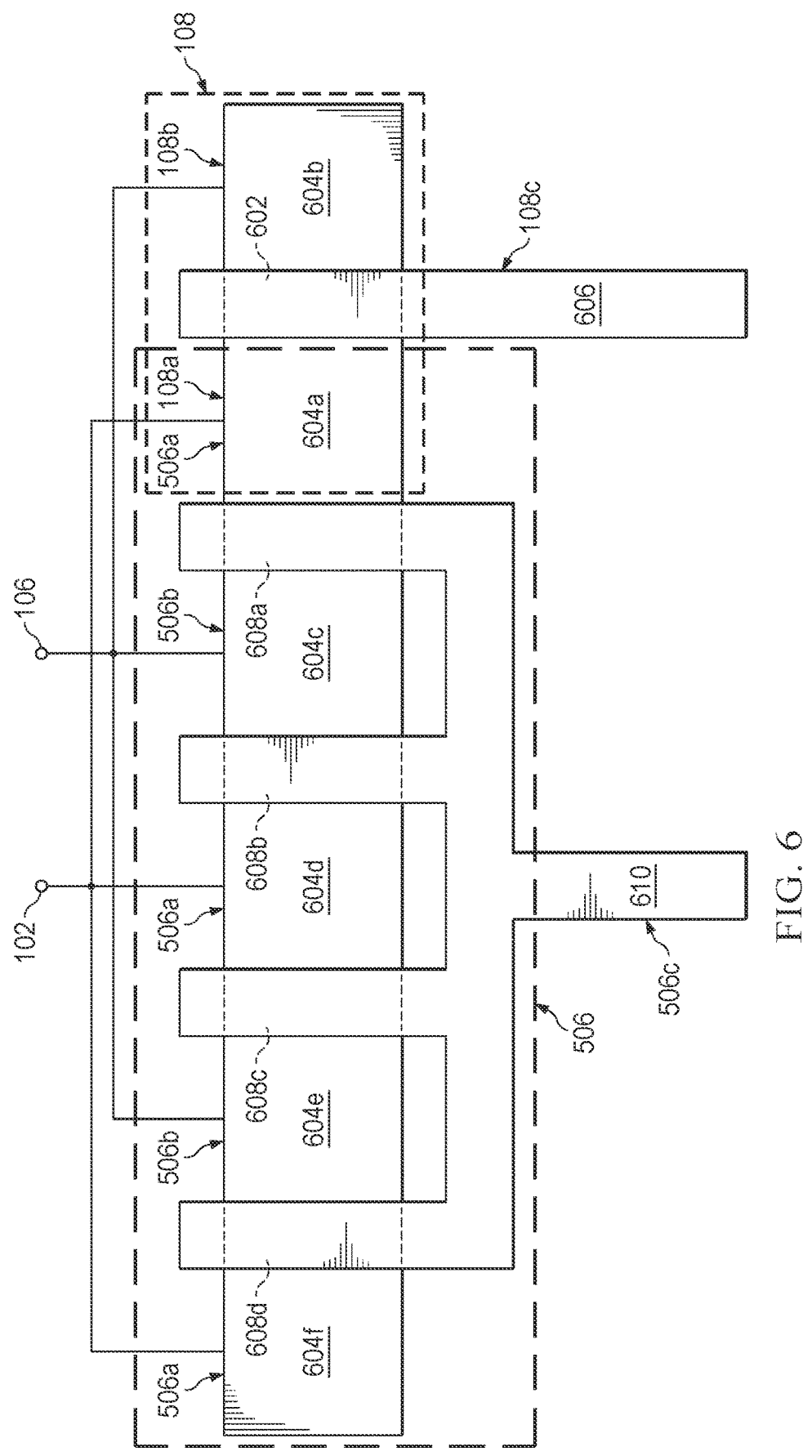
FIG. 6 is a top view of some examples of an integrated chip including a transistor device.

FIG. 6 is a top view of one example of an integrated chip including transistor 108 and transistor 506. Transistor 108 includes a channel 602 extending between a first source/drain region 604*a* and a second source/drain region 604*b*. A first gate electrode 606 extends over channel 602. The first source/drain region 604*a* is coupled to the first voltage input 102 and forms the first terminal 108*a* of transistor 108. The second source/drain region 604*b* is coupled to the voltage output 106 and forms the second terminal 108*b* of transistor 108. The first gate electrode 606 forms the control terminal 108*c* of transistor 108.

Further, transistor 506 includes a first channel 608*a* extending between the first source/drain region 604*a* and a third source/drain region 604*c*, a second channel 608*b* extending between the third source/drain region 604*c* and a fourth source/drain region 604*d*, a third channel 608*c* extending between the fourth source/drain region 604*d* and a fifth source/drain region 604*e*, and a fourth channel 608*d* extending between the fifth source/drain region 604*e* and a sixth source/drain region 604*f*. A first finger of a second gate electrode 610 extends over the first channel 608*a*, a second finger of the second gate electrode 610 extends over the second channel 608*b*, a third finger of the second gate electrode 610 extends over the third channel 608*c*, and a fourth finger of the second gate electrode 610 extends over the fourth channel 608*d*. The first source/drain region 604*a*, the fourth source/drain region 604*d*, and the sixth source/drain region 604*f* are coupled to the first voltage input 102 and form the first terminal 506*a* of transistor 506. The third source/drain region 604*c* and the fifth source/drain region 604*e* are coupled to the voltage output 106 and form the second terminal 506*b* of transistor 506. The second gate electrode 610 forms the control terminal 506*c* of transistor 506.

Although transistor 108 and transistor 506 are illustrated as planar transistors in FIG. 6, in some other examples, transistor 108 and transistor 506 may alternatively be three-dimensional transistors (e.g., fin field effect transistors, gate-all-around field effect transistors, or the like).

FIG. 7 is an example timing diagram corresponding to the circuit 500 of FIG. 5A and FIG. 5B.

During normal ON mode (e.g., when the power supply (voltage source 304 and voltage converter 306) is coupled to the circuit 500, the first voltage input 102 is to be coupled to the voltage output 106 via both the first current path 110 and the sixth current path 507, and there are no supply current restrictions), the first control signal 202 is HIGH (when the inverted first control signal is LOW) and the third control signal 702 is HIGH (when the inverted third control signal is LOW). In response, transistor 402 and transistor 514 are ON while transistor 404 and transistor 518 are OFF so that the second voltage input 104 is coupled to control terminal 108c (via the first control path 114) and the third voltage input 502 is coupled to control terminal 506c (via the third control path 516). Thus, the voltage at control terminal 108c is HIGH and the voltage at control terminal 506c is HIGH. In response, transistor 108 and transistor 506 are ON so that the first voltage input 102 is coupled to the voltage output 106 through transistor 108 (via the first current path 110) and through transistor 506 (via the sixth current path 507). Thus, the voltage at the voltage output 106 is HIGH. Further, the second control signal 204 is LOW. Thus, transistor 406 and transistor 522 are OFF and hence transistor 408, transistor 410, transistor 528, and transistor 530 are OFF. Furthermore, because the voltage output is non-negative, transistor 416, transistor 420, transistor 538, and transistor 544 are OFF and hence transistor 414 and transistor 534 are OFF.

During normal OFF mode (e.g., when the power supply is coupled to the circuit 500, the first voltage input 102 is not to be coupled to the voltage output 106, and there are no power supply current restrictions), the first control signal 202 is LOW and the third control signal 702 is LOW. In response, transistor 404 and transistor 518 are ON while transistor 402 and transistor 514 are OFF so that the voltage output 106 is coupled to the control terminal 108c of transistor 108 (via the second control path 116) and the control terminal 506c of transistor 506 (via the fourth control path 520). Thus, the voltage at control terminal 108c is LOW and the voltage at control terminal 506c is LOW. In response, transistor 108 is OFF and transistor 506 is OFF so that the first voltage input 102 is not coupled to the voltage output 106. Thus, the voltage output 106 is LOW. Further, the second control signal 204 is HIGH. Because the second control signal 204 is HIGH, transistor 406, transistor 408, and transistor 410 are ON and transistor 522, transistor 528, and transistor 530 are ON. Furthermore, because the voltage at control terminal 108c is non-negative and the voltage at control terminal 506c is non-negative, transistor 416, transistor 420, transistor 538, and transistor 544 are OFF and hence transistor 414 and transistor 534 are OFF.

During low power mode (e.g., when the power supply is coupled to the circuit 500, transistor 108 is to be ON, transistor 506 is to be OFF, and the amount of current consumed by the power supply must be less than about 10 microamps, less than about 8 microamps, less than about 6 microamps, or some other suitable value), the first control signal 202 is HIGH and the third control signal 702 is LOW. In response, transistor 402 is ON, transistor 514 is OFF, transistor 404 is OFF, and transistor 518 is ON so that the second voltage input 104 is coupled to control terminal 108c and the voltage output 106 is coupled to control terminal 506c. Thus, the voltage at control terminal 108c is HIGH and the voltage at control terminal 506c is LOW. In response, transistor 108 is ON and transistor 506 is OFF so that the first voltage input 102 is coupled to the voltage output 106 through transistor 108 (via the first current path) but not through transistor 506. Because the first voltage input 102 is coupled to the voltage output 106 through transistor 108 (via the first current path) but not through transistor 506, the voltage at the voltage output 106 may be slightly lower than during normal ON mode, but the voltage at the voltage output 106 is still HIGH. Further, the second control signal 204 is LOW. Thus, transistor 406 and transistor 522 are OFF and hence transistor 408, transistor 410, transistor 528, and transistor 530 are OFF. Furthermore, because the voltage at the voltage output 106 is non-negative, transistor 416, transistor 420, transistor 538, and transistor 544 are OFF and hence transistor 414 and transistor 534 are OFF.

In some examples, the second voltage input 104 is coupled to a first voltage converter (e.g., voltage converter 306 of FIG. 3) and the third voltage input 502 is coupled to a second voltage converter (not shown). The first voltage converter (not shown) is smaller (e.g., includes less stages) than the second voltage converter and more efficient than the second voltage converter. During low power mode, the second voltage input 104 is coupled to control terminal 108c but the third voltage input 502 is not coupled to control terminal 506c so that the more efficient voltage converter (the first voltage converter) is used and the less efficient voltage converter (the second voltage converter) is decoupled from the circuit. By using the more efficient voltage converter and decoupling the less efficient voltage converter during low power mode, the current consumed by power supply (e.g., the voltage source 304 of FIG. 3, the first voltage converter 306 of FIG. 3, and the second voltage converter (not shown)) during low power mode is reduced. As a result, the power supply current consumption requirement for low power mode can be achieved.

Further, because transistor 108 is used during both normal ON mode and low power mode, the resistance between the first voltage input 102 and the voltage output 106 may only be slightly higher during low power mode than during normal ON mode. Thus, the difference between the voltage at the voltage output 106 during normal ON mode and the voltage at the voltage output 106 during low power mode may be negligible. Further, because transistor 108 is used during both normal ON mode and low power mode, the transition from low power mode to normal ON mode can occur more quickly.

During negative output voltage mode (e.g., when the voltage at the voltage output 106 is negative, the power supply is coupled to the circuit 500, and the first voltage input 102 is not to be coupled to the voltage output 106), transistor 108 and transistor 506 may be briefly turned ON. Because the voltage at the voltage output 106 is negative, the transistor 420, transistor 416, transistor 544, and transistor 538 are ON and hence transistor 414 and transistor 534 are ON. In response, control terminal 108c is coupled to the voltage output 106 through transistor 414 (via the fourth current path 132) and control terminal 506c is coupled to the voltage output 106 through transistor 534 (via the current path 536). Thus, the difference between the voltage at control terminal 108c and the voltage at the voltage output 106 drops to approximately zero and the difference between the voltage at control terminal 506c and the voltage at the voltage output 106 drops to approximately zero. In response, transistor 108 turns OFF and transistor 506 turns OFF.

During sleep mode (e.g., when the power supply is coupled to the circuit 500, and the first voltage input 102 is not to be coupled to the voltage output 106, and the amount of current consumed by the power supply connected to the circuit must be less than 2 microamps, less than 1 microamp, or some other suitable value), the first control signal 202 and the third control signal 702 are unavailable. Thus, transistor 402 and transistor 404 do not couple control terminal 108c to the second voltage input 104 nor the voltage output 106 and transistor 514 and transistor 518 do not couple control terminal 506c to the third voltage input 502 nor the voltage output 106. However, the second control signal 204 remains available and is HIGH. Because the second control signal 204 is HIGH, the voltage at control terminal 108c is non-negative, and the voltage at control terminal 506c is non-negative, transistor 406, transistor 408, transistor 410, transistor 522, transistor 528, and transistor 530 are ON. Thus, control terminal 108c is coupled to ground 122 (via the second current path 124 and the third current path 126) and control terminal 506c is coupled to ground 122 (via the seventh current path 524 and the eighth current path 526). In response, transistor 108 and transistor 506 are OFF. Thus, the voltage at the voltage output 106 is LOW. Furthermore, because the voltage at the voltage output 106 is non-negative, transistor 416, transistor 420, transistor 538, and transistor 544 are OFF and hence transistor 414 and transistor 534 are OFF.

During no power supply mode (e.g., when the power supply is not coupled to the circuit 500 and the first voltage input 102 is not to be coupled to the voltage output 106), the first control signal 202 and the third control signal 702 are unavailable. Thus, transistor 402 and transistor 404 do not couple control terminal 108c to the second voltage input 104 nor the voltage output 106 and transistor 514 and transistor 518 do not couple control terminal 506c to the third voltage input 502 nor the voltage output 106. However, the second control signal 204 remains available and is HIGH. Because the second control signal 204 is HIGH, the voltage at control terminal 108c is non-negative, and the voltage at control terminal 506c is non-negative, transistor 406 transistor 408, transistor 410, transistor 522, transistor 528, and transistor 530 are ON. Thus, control terminal 108c is coupled to ground 122 (via the second current path 124 and the third current path 126) and control terminal 506c is coupled to ground 122 (via the seventh current path 524 and the eighth current path 526). In response, transistor 108 and transistor 506 are OFF. Thus, the voltage at the voltage output 106 is LOW. Furthermore, because the voltage at the voltage output 106 is non-negative, transistor 416, transistor 420, transistor 538, and transistor 544 are OFF and hence transistor 414 and transistor 534 are OFF.

Because protection circuitry 120, protection circuitry 130, protection circuitry 510, and protection circuitry 512 only require the second control signal 204 (which is available even when the power supply is not coupled to the circuit 500) to operate, protection circuitry 120, protection circuitry 130, protection circuitry 510, and protection circuitry 512 can reliably protect transistor 108 and transistor 506 even when the power supply is not coupled to the circuit 500.

The methods are illustrated and described above as a series of acts or events, but the illustrated ordering of such acts or events is not limiting. For example, some acts or events may occur in different orders and/or concurrently with other acts or events apart from those illustrated and/or described herein. Also, some illustrated acts or events are optional to implement one or more aspects or embodiments of this description. Further, one or more of the acts or events depicted herein may be performed in one or more separate acts and/or phases. In some embodiments, the methods described above may be implemented in a computer readable medium using instructions stored in a memory.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors are described herein, other transistors (or equivalent devices) may be used instead with little or no change to the remaining circuitry. For example, a metal-oxide-silicon FET ("MOSFET") (such as an n-channel MOSFET, nMOSFET, or a p-channel MOSFET, pMOSFET), a bipolar junction transistor (BJT—e.g. NPN or PNP), insulated gate bipolar transistors (IGBTs), and/or junction field effect transistor (JFET) may be used in place of or in conjunction with the devices disclosed herein. The transistors may be depletion mode devices, drain-extended devices, enhancement mode devices, natural transistors or other type of device structure transistors. Furthermore, the devices may be implemented in/over a silicon substrate (Si), a silicon carbide substrate (SiC), a gallium nitride substrate (GaN) or a gallium arsenide substrate (GaAs).

While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means +/–10 percent of the stated value, or, if the value is zero, a reasonable range of values around zero.

Modifications are possible in the described examples, and other implementations are possible, within the scope of the claims.

What is claimed is:

1. A circuit comprising:
a first voltage input, a second voltage input, and a voltage output;
a transistor coupled between the first voltage input and the voltage output, the transistor having a control terminal;
first circuitry coupled between the second voltage input and the voltage output, the first circuitry having an output coupled to the control terminal of the transistor;
second circuitry coupled between the control terminal of the transistor and a ground terminal, the second circuitry separate from the first circuitry; and
third circuitry coupled between the control terminal of the transistor and the voltage output, the third circuitry separate from the first circuitry and the second circuitry.

2. The circuit of claim 1, wherein the third circuitry includes a control terminal coupled to the voltage output, the circuit further comprising:
a first control signal input coupled to a control terminal of the first circuitry; and
a second control signal input coupled to a control terminal of the second circuitry.

3. The circuit of claim 1, wherein the transistor is a first transistor, the second circuitry including:
a second transistor coupled between the control terminal of the first transistor and the ground terminal;
a first unidirectional current device coupled between the control terminal of the first transistor and a terminal of the second transistor; and
a second unidirectional current device coupled between the control terminal of the first transistor and the terminal of the second transistor.

4. The circuit of claim 3, the third circuitry including:
a third transistor coupled between the control terminal of the first transistor and the voltage output;
a third unidirectional current device coupled between the voltage output and the ground terminal; and
a fourth unidirectional current device coupled between a terminal of the third unidirectional current device and the ground terminal, wherein a control terminal of the third transistor is coupled between the terminal of the third unidirectional current device and a terminal of the fourth unidirectional current device.

5. The circuit of claim 4, further comprising:
a first control signal input coupled to a control terminal of the second transistor.

6. The circuit of claim 1, wherein the transistor is a first transistor, the circuit further comprising:
a third voltage input;
a second transistor coupled between the first voltage input and the voltage output;
fourth circuitry coupled between the third voltage input and the voltage output, the fourth circuitry having an output coupled to a control terminal of the second transistor;
fifth circuitry coupled between the control terminal of the second transistor and ground; and
sixth circuitry coupled between the control terminal of the second transistor and the voltage output.

7. The circuit of claim 1, wherein the first circuitry has a control input and is configurable to provide a first current path between the second voltage input and the control terminal of the transistor responsive to the control input having a first state and provide a second current path between the control terminal of the transistor and the voltage output responsive to the control input having a second state.

8. The circuit of claim 1, wherein the second circuitry is configurable to enable a first current path from the control terminal to the ground terminal responsive to a voltage at the control terminal being non-negative; and the third circuitry is configurable to enable a second current path from the control terminal to the voltage output responsive to voltage at the control terminal being negative.

9. A circuit comprising:
a first voltage input, a second voltage input, a first control signal input, a second control signal input, and a voltage output;
a first transistor coupled between the first voltage input and the voltage output;
a second transistor including a first terminal coupled to second voltage input, a second terminal coupled to a control terminal of the first transistor, and a control terminal coupled to the first control signal input;
a third transistor including a first terminal coupled to the control terminal of the first transistor, a second terminal coupled to the voltage output, and a control terminal coupled to the first control signal input;
a fourth transistor coupled between the control terminal of the first transistor and a ground terminal, the fourth transistor including a control terminal coupled to the second control signal input;
a fifth transistor coupled between the control terminal of the first transistor and the first terminal of the fourth transistor;
a sixth transistor coupled between the control terminal of the first transistor and the first terminal of the fourth transistor;
a seventh transistor coupled between the control terminal of the first transistor and the voltage output;
an eighth transistor coupled between the ground terminal and the voltage output, the eighth transistor including a control terminal coupled to a control terminal of the seventh transistor; and
a nineth transistor coupled between the ground terminal and the first terminal of the eighth transistor.

10. The circuit of claim 9, wherein the fifth transistor and the sixth transistor are diode-connected transistors configurable to allow unidirectional current flow from the control terminal of the first transistor to the ground terminal, and wherein the eighth transistor and the nineth transistor are diode-connected transistor configurable to allow unidirectional current flow from the ground terminal to the voltage output.

11. The circuit of claim 9, wherein the control terminal of the fifth transistor is coupled to the first terminal of the fifth transistor, the control terminal of the sixth transistor is coupled to the first terminal of the sixth transistor, the control terminal of the eighth transistor is coupled to the first terminal of the eighth transistor, and the control terminal of the nineth transistor is coupled to the second terminal of the nineth transistor.

12. The circuit of claim 9, further comprising:
a first resistor coupled between the control terminal of the first transistor and the first terminal of the sixth transistor; and
a second resistor coupled between the first terminal of the eighth transistor and the first terminal of the nineth transistor.

13. The circuit of claim 9, further comprising:
a third voltage input; and
a tenth transistor coupled between the first voltage input and the voltage output.

14. The circuit of claim 13, further comprising:
an eleventh transistor coupled between a control terminal of the tenth transistor and the ground terminal;
a twelfth transistor coupled between the control terminal of the tenth transistor and the first terminal of the eleventh transistor;
a thirteenth transistor coupled between the control terminal of the tenth transistor and the first terminal of the eleventh transistor;
a fourteenth transistor coupled between the control terminal of the tenth transistor and the voltage output;
a fifteenth transistor coupled between the ground terminal and the voltage output; and
a sixteenth transistor coupled between the first terminal of the fifteenth transistor and the ground terminal.

15. The circuit of claim 14, further comprising:
a third control signal input;
a seventeenth transistor including a first terminal coupled to the second voltage input, a second terminal coupled to the control terminal of the tenth transistor, and a control terminal coupled to the third control signal input; and
an eighteenth transistor including a first terminal coupled to the control terminal of the tenth transistor, a second terminal coupled to the voltage output, and a control terminal coupled to the third control signal input.

16. The circuit of claim 14, wherein the first transistor has a first number of channels, the tenth transistor has a second number of channels, and the second number is greater than the first number.

17. A system comprising:
a controller including a first output and a second output;
a voltage source;
a voltage converter including an input and an output, the input of the voltage converter coupled to the voltage source;
load circuitry including an input; and
switching circuitry coupled to the controller, the voltage source, the voltage converter, and the load circuitry, the switching circuitry including:
a first voltage input coupled to the voltage source;
a second voltage input coupled to the output of the voltage converter;
a voltage output coupled to the input of the load circuitry;
a first control signal input coupled to the first output of the controller;

a second control signal input coupled to the second output of the controller;
a first transistor coupled between the first voltage input and the voltage output in a first current path, the first current path including the first voltage input, a first terminal of the first transistor, a second terminal of the first transistor, and the voltage output;
transistor control circuitry coupled between the second voltage input and the voltage output, the transistor control circuitry having a control input and a control output, the control input coupled to the first control signal input, and the control output coupled to a control terminal of the first transistor;
first protection circuitry coupled between the control terminal of the first transistor and a ground terminal, the first protection circuitry separate from the transistor control circuitry, the first protection circuitry having an input coupled to the second control signal input, the first protection circuitry configurable to, responsive to a state of the second control signal input and a voltage at the control terminal being non-negative, enable a first current path from the control terminal of the first transistor to the ground terminal; and
second protection circuitry coupled between the control terminal of the first transistor and the voltage output, the second protection circuitry separate from the first protection circuitry and the transistor control circuitry and configurable to provide a second current path from the control terminal of the first transistor to the voltage output.

18. The system of claim 17, the first protection circuitry including:
a second transistor coupled between the control terminal of the first transistor and the ground terminal, the second transistor including a control terminal coupled to second control signal input;
a first unidirectional current device coupled between the control terminal of the first transistor and the first terminal of the second transistor; and
a second unidirectional current device coupled between the control terminal of the first transistor and the first terminal of the second transistor.

19. The system of claim 18, the second protection circuitry including:
a third transistor coupled between the control terminal of the first transistor and the voltage output;
a third unidirectional current device coupled between ground and the voltage output; and
a fourth unidirectional current device coupled between the ground terminal and the first terminal of the third unidirectional current device, wherein a control terminal of the third transistor is coupled between the first terminal of the third unidirectional current device and the first terminal of the fourth unidirectional current device.

20. The system of claim 17, further comprising:
a second transistor coupled between the first voltage input and the voltage output;
third protection circuitry coupled between a control terminal of the second transistor and the ground terminal, the third protection circuitry including a control terminal coupled to the second control signal input, the third protection circuitry configurable to, responsive to a state of the second control signal input and a voltage at the control terminal of the second transistor being non-negative, enable a third current path from the control terminal of the second transistor to the ground terminal; and fourth protection circuitry coupled between the control terminal of the second transistor and the voltage output, the fourth protection circuitry configurable to enable a second current path from the control terminal of the second transistor to the voltage output responsive to a voltage at the control terminal of the second transistor being negative.

21. The system of claim 17, wherein the voltage source is a battery, the voltage converter is a charge pump, and the controller is a microcontroller.

\* \* \* \* \*